(12) United States Patent
Laig-Horstebrock et al.

(10) Patent No.: US 6,653,818 B2
(45) Date of Patent: Nov. 25, 2003

(54) METHOD FOR PREDICTING THE EQUILIBRATED OPEN-CIRCUIT VOLTAGE OF AN ELECTROCHEMICAL ENERGY STORE

(75) Inventors: Helmut Laig-Horstebrock, Frankfurt (DE); Eberhard Meissner, Wunstorf (DE)

(73) Assignee: VB Autobatterie GmbH, Hannover (DE)

( * ) Notice: Subject to any disclaimer, the term of this patent is extended or adjusted under 35 U.S.C. 154(b) by 0 days.

(21) Appl. No.: 10/163,808

(22) Filed: Jun. 6, 2002

(65) Prior Publication Data

US 2003/0001542 A1 Jan. 2, 2003

(30) Foreign Application Priority Data

Jun. 8, 2001 (DE) .......................... 101 28 033

(51) Int. Cl.⁷ ........................ H01M 10/44; H01M 10/46
(52) U.S. Cl. ....................... 320/132; 320/150
(58) Field of Search ................ 320/127, 128, 320/132, 134, 136, 150; 324/426, 427, 430, 433

(56) References Cited

U.S. PATENT DOCUMENTS 5,219,676 A * 6/1993 Bullock et al.

6,163,133 A  12/2000 Laig-Horstebrock et al.

FOREIGN PATENT DOCUMENTS

| DE | 35 20 985 C2 | 12/1986 |
| DE | 198 47 648 A1 | 4/2000 |

* cited by examiner

*Primary Examiner*—Edward H. Tso
(74) *Attorney, Agent, or Firm*—Foley & Lardner

(57) ABSTRACT

In a method for predicting the equilibrated open-circuit voltage of an electrochemical energy store by measuring the voltage settling response $U_o(t)$ in a load-free period, a formulaic relationship between the equilibrated open-circuit voltage $U_{oo}$ and the decaying voltage $U_o(t)$ of the form $U_{oo}=U_o(t)-w*\ln(t)-w*F(T)$ is used, the prefactor w being the experimentally determined slope of the dependency of $U_o$ on $\ln(t)$ at the time t, $w=-(u_o(t2)-U_o(t1))/\ln(t2/t1)$, and $U_o(t1)$ being the unloaded voltage $U_o$ at the time t1 and $U_o(t2)$ being the unloaded voltage $U_o$ at the later time $t2>t1$, and F(T) being a function which depends only on the absolute temperature T of the energy store. The function F(T) has the general form $F(T)=(K|E/T)/(1+q*w)/f(T)$, K, E and q being experimentally determined constants, T being the absolute temperature in kelvin, and f(T) being a function which contains only the absolute temperature T as a free parameter.

14 Claims, 1 Drawing Sheet

METHOD FOR PREDICTING THE EQUILIBRATED OPEN-CIRCUIT VOLTAGE OF AN ELECTROCHEMICAL ENERGY STORE

RELATED APPLICATION

This application claims priority of DE 101 28 033.5, filed Jun. 8, 2001.

FIELD OF THE INVENTION

This invention relates to a method for predicting the equilibrated open-circuit voltage of an electrochemical energy store by measuring the voltage settling response Uo(t) in a load-free period.

BACKGROUND

For determining the state of charge of electrochemical energy stores, it is often possible to use its correlation with the open-circuit voltage. This applies to both primary and secondary stores (accumulators/batteries). One example of this is a lead-acid accumulator, in which the state of charge can be linked to the acid concentration, which can in turn be derived from the open-circuit voltage.

A difficulty which arises with many batteries systems and, in particular, with a lead-acid battery, is that the open-circuit voltage settles only very slowly after the battery has been loaded. The situation is often encountered that the rest pauses are so short that there is no opportunity to wait until the transients of the open-circuit voltage have settled to deduce the state of charge from its steady-state value.

DE 3520985 C2 describes a method for determining the state of charge of a lead-acid accumulator, which presupposes a substantially post-transient state of the lead-acid accumulator. For example, a resting time of at least five hours is recommended before the open-circuit voltage is assumed to have been reached and is determined, but the decay response is not evaluated.

DE-198 47 648 A1 and U.S. Pat. No. 6,163,133 describe a method for determining the state of charge of a lead-acid accumulator by measuring the open-circuit voltage, which uses the response of the voltage response before a post-transient state is reached. The approach selected there does not, however, take temperature dependency into account, which can cause interference especially at low temperatures, and it is restricted to evaluations at set times.

It would, therefore, be advantageous to be able to deduce the genuine open-circuit voltage from the time response of the transients of the load-free voltage (or the voltage under only a small load), before a steady-state open-circuit voltage has settled. This would provide the prerequisite for the use of a method to determine the state of charge from the open-circuit voltage value. It would also be advantageous to determine the actual equilibrated open-circuit voltage from the nonsteady-state voltage response of an unloaded electrochemical store, and the state of charge therefrom.

SUMMARY OF THE INVENTION

This invention relates to a method for predicting an equilibrated open-circuit voltage of an electrochemical storage battery including measuring a voltage settling response Uo(t) in a load-free period using a relationship (1) between an equilibrated open-circuit voltage Uoo and a decaying voltage Uo(t)

$$Uoo=Uo(t)-w*\ln(t)-w*F(T) \quad (1),$$

wherein w is an experimentally determined slope of dependency of Uo on ln(t) at time t, $w=-(Uo(t2)-Uo(t1))/\ln(t2/t1)$, Uo(t1) is an unloaded voltage Uo at time t1, Uo(t2) is an unloaded voltage Uo at later time t2>t1, and F(T) is a function which depends only on absolute temperature T of the battery.

This invention also relates to a method of predicting state of charge including measuring the voltage settling response of the storage battery and comparing the voltage settling response to true open-circuit voltage Uoo and the decay voltage Uo(t) to determine the state of charge.

BRIEF DESCRIPTION OF THE DRAWING

The Drawing is a graph (time in seconds v. state of charge in volts) of a decay response for a zero-load battery voltage after a charging pulse of 19A for 15 minutes.

DETAILED DESCRIPTION

Figure 1:
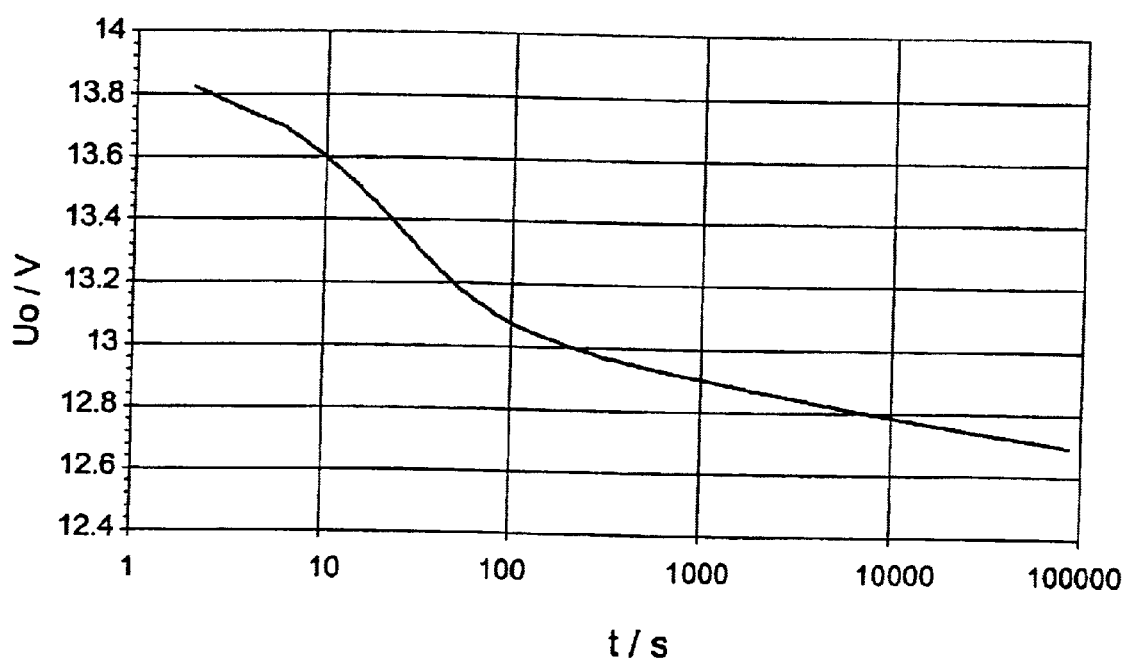

The method described below is suitable, in particular, for determining the open-circuit voltage of lead-acid accumulators, with the aim of ascertaining the state of charge, but it is not restricted thereto. It can also be used in other accumulators, and also in non-rechargeable electrochemical stores (primary elements). Accumulators will be generally discussed below for simplicity.

When determining the equilibrated open-circuit voltage of an electrochemical energy store, in particular, of an accumulator, it is necessary to decide whether the accumulator has been charged or discharged prior to the zero-current period employed for the evaluation. In this context, "zero current" is intended to mean a state with electrical loading whose magnitude is less than the 100-hour current, preferably less than the 1000-hour current, and particularly advantageously less than the 10,000-hour current.

The voltage measured in a zero-current state in this sense is referred to here as the "unloaded voltage."

After previous charging, the present voltage immediately after switching off the electrical load is higher than the steady-state open-circuit voltage. The unloaded voltage first drops rapidly and then ever more slowly, and does not reach the steady-state open-circuit voltage value—depending on the conditions of the previous charging—until after many hours or (at low temperature) after days.

At two times t1 and t2 during this decay of the unloaded voltage Uo after charging, a slope w can be calculated according to the formula $$w=-(Uo(t2)-Uo(t1))/\ln(t2/t1) \quad (1)$$

wherein Uo(t1) is the unloaded voltage Uo at time t1 and Uo(t2) is the unloaded voltage Uo at time t2.

w is re-calculated continuously or sporadically according to (1).

An extrapolation to the genuine (equilibrated) open-circuit voltage Uoo at the time t2 using a relationship of the form $$Uoo=Uo(t2)-w/f(T)*(K+E/(T))/(1+q*w)+w*\ln(t2) \quad (2)$$

is then possible by using the constants K, E and q as well as an auxiliary function f(T) of the form $$f(T)=a+b*EXP(-(T-c)/d), \quad (3)$$

wherein the absolute temperature T of the accumulator in kelvin is used. The quantities a, b, c and d are constants to be determined empirically.

Instead of calculating the relationships indicated in the formulae afresh, it is also possible to use corresponding tables with discrete values.

For a lead-acid accumulator, the constants a, b, c, d of the function f(T) are selected from the following value range:

a between about 0.01 and about 0.2, preferably approximately 0.04, b between about 0.001 and about 0.05, preferably approximately 0.009, c between about 250 and about 350, preferably approximately 270, d between about 5 and about 50, preferably approximately 17.

The constants E, K and q of the function F(T) for an individual cell, in the event that the unloaded phase was preceded by charging, are selected from the following value range:

E between about 50 K and about 500 K, preferably approximately 116 K,

K between about −0.1 and about −2, preferably approximately −0.34, q between about 50 V$^{-1}$ and about 1000 V$^{-1}$, preferably approximately 190 V$^{-1}$.

The constants E, K and q of the function F(T) for an individual cell, in the event that the unloaded phase was preceded by discharging, are selected from the following value range:

E between about 10 K and about 500 K, preferably approximately 60 K,

K between about −0.05 and about −1, preferably approximately −0.19, q between about −50 V$^{-1}$ and about −1000 V$^{-1}$, preferably approximately −150 V$^{-1}$.

For a lead-acid accumulator, the auxiliary function (3) may be written specifically, for example, and advantageously with the numerical values indicated in (3a) for the constants a, b, c and d:

$$f(T)=0.0393+0.00876*EXP(-(T-269)/16.83). \quad (3a)$$

This equation applies to a lead-acid accumulator with 6 cells and a rated voltage of 12 V. For an individual cell, this becomes:

$$f(T)=0.00655+0.00146*EXP(-(T-269)/16.83). \quad (3b)$$

Furthermore, for example, and advantageously, the constants, determined empirically from measurements, given in (4a) are employed as the constants E, K and q used in (2) for a lead-acid accumulator with 6 cells and a rated voltage of 12 V:

E=696.0 K

K=−2.028 q=31.16 V$^{-1}$ (4a)

For an individual cell, they are the values given in (4b):

E=116.0 K

K=−0.338 q=187 V$^{-1}$ (4b)

The above considerations apply when the accumulator was charged prior to the zero-current period employed for the evaluation.

In the event of a discharge preceding the zero-current period, the same equations (1), (2) and (3) apply, and the parameters of (3) described in (3a) are also advantageously used, with only the parameters of (2) being changed. As the constants E, K and q used in (2) after a discharge, for example, and advantageously, the constants, determined empirically from measurements, given in (4c) are employed for a lead-acid accumulator with 6 cells and a rated voltage of 12 V:

E=351.86 K

K=−1.1226 q=−24.86 V$^{-1}$ (4c)

For an individual cell, they are the values given in (4d):

E=58.64 K

K=−0/187 q=−149 V$^{-1}$ (4d)

The formulae (1), (2) and (3) can be applied until the transition to the steady state, since w then becomes zero.

The relationships (1), (2) and (3) are valid on the precondition that the accumulator has been charged strongly (for a fairly long time with at least 1 V more than the open-circuit voltage in the case of a 12 V lead-acid accumulator), or discharged strongly, prior to the zero-current period employed for the evaluation.

If, however, the charging or discharge prior to the end of the current flow was only weak, or the start time of the measurement (i.e. of the zero-current period) is unclear due to interference, then it is advantageous to adjust the timescale.

If only weak charging took place before the beginning of the zero-current period, then the situation (voltage) that does not occur, with strong charging, until significantly later is already encountered after a short time during the decay of the voltage. It is, therefore, valid to recalculate the time scale in the model consisting of equations (1), (2) and (3) which applies to the case of strong charging (or discharging).

To that end, a time to, which has already elapsed for the model consisting of equations (1), (2) and (3), is added to the measurement time t (measured since the beginning of the zero-current phase). This is done a single time at the beginning of the decay situation. It is recommended to avoid experiencing vitiation due to start interference, not to carry out the calculation until after about 100 to about 500 s. The relationship for determining is:

$$to = -t - \frac{\hat{u}}{dUo(t)/dt}, \quad (5)$$

wherein û stands for the Tafel slope that is known from electrochemistry for the kinetics of the process governing the voltage response. Clearly, equation (5) can no longer be used when the steady state has already very nearly been reached (i.e., dUo/dt is small) or fully (dUo/dt=0).

Typical empirical values can be used as û for a 6-cell lead-acid accumulator, e.g., 0.043 V at 25° C. and 0.063 V at −20° C. Linear interpolation or extrapolation is carried out for other temperatures. In the case of a one-cell lead-acid accumulator, these correspond to approximately 0.007 V at 25° C. and approximately 0.01 V at −20° C.

In the extrapolation equations (1) and (2), it is then appropriate to use t+to, with the value to calculated according to (5), instead of the measurement time t, so that the relationships (1a) and (2a) are obtained $$w=-(Uo(t2)-Uo(t1))/\ln((t2+to)/(t1+to)) \quad (1a)$$

$$Uoo=Uo(t2)-w/f(T)*(K+E/(T))/(1+q*w)+w*\ln(t2+to) \quad (2a)$$

The relationship (3) with the specific numerical values from (3a) can be used unchanged.

The empirically determined constants (4a, 4b, 4c, 4d), furthermore, apply unchanged for the situation in question.

A complex case exists if, for example, a brief discharge took place after charging before the zero-current period began. In such cases, the unloaded voltage first increases from its start value below the balanced open-circuit voltage value and beyond it and, as it rises, joins up with a descending decay curve. The subsequent response is the same as that which would have been observed if the brief discharge had not taken place.

The response in the event of a discharge followed by brief charging, before the zero-current period begins, is the mirror image.

Since such situations are quite likely, it is recommended not to begin the actual evaluation until about 1 hour after the start of the zero-current period.

EXAMPLES

The Drawing shows a typical decay response for the zero-load battery voltage after a charging pulse of 19 A lasting 15 minutes. The battery has a capacity of 95 Ah at a rated voltage of 12 V.

Corresponding to the situation according to the invention, the time axis is graduated logarithmically. After about 100 s, the voltage response in this plot becomes a straight line. The evaluation according to equations (1), (2) and (3) is valid in this range.

Even after 24 hours, the decay has not yet ended. The genuine open-circuit voltage in the case in question was determined by circumscribing the situation between two tests, in which the zero-current period was preceded by a discharge instead of charging. Since the settling of the open-circuit voltage from a discharge takes place very much more quickly, these tests were carried out in such a way that the open-circuit voltage was determined from a discharge for states of charge 5% above and 5% below the state of charge of the situation in the Drawing, and then the genuine open-circuit voltage was calculated by interpolation for the case of decay from charging.

In the case of the Drawing, the genuine (balanced) open-circuit voltage was 12.61 V. The voltages after 2 h and 4 h were 12.801 V and 12.769 V, respectively. By applying equations (1), (2) and (3), an open-circuit voltage value of 12.619 V was calculated, i.e., 9 mV above the actual value.

The parameter values given in (4a) and (4c) were checked in a large number of measurements on lead-acid accumulators with states of charge between 50% and 90% and temperatures between −20° C. and +25° C. In those cases, an average deviation of the voltage values calculated using (1), (2) and (3) from the actual open-circuit voltage values (determined by interpolation between two tests with preceding discharge, see above) of ±25 mV was obtained, which corresponds to an error of approximately ±2.5% in the state of charge.

What is claimed is:

1. A method for predicting an equilibrated open-circuit voltage of an electrochemical storage battery comprising measuring a voltage settling response Uo(t) in a load-free period using a relationship (1) between an equilibrated open-circuit voltage Uoo and a decaying voltage Uo(t)

$$Uoo=Uo(t)-w*\ln(t)-w*F(T) \quad (1),$$

wherein w is an experimentally determined slope of dependency of Uo on ln(t) at time t, w=−(Uo(t2)−Uo(t1))/ln(t2/t1), Uo(t1) is an unloaded voltage Uo at time t1, Uo(t2) is an unloaded voltage Uo at later time t2>t1, and F(T) is a function which depends only on absolute temperature T of the battery.

2. The method as claimed in claim 1, wherein F(T)=(K+E/T)/(1+q*w)/f(T), and wherein K, E and q are experimentally determined constants, T is absolute temperature in kelvin, and f(T) is a function which contains only the absolute temperature T as a free parameter.

3. The method as claimed in claim 2, wherein the function f(T) of the absolute temperature T has the general form f(T)=a+b*EXP(−(T−c)/d).

4. The method of claim 3, wherein the battery is a lead-acid battery, and constants a, b, c, d are selected from:
   a between about 0.01 and about 0.2,
   b between about 0.001 and about 0.05,
   c between about 250 and about 350, and
   d between about 5 and about 50.

5. The method as claimed in claim 3, wherein a is about 0.04, b is about 0.009, c is about 270 and d is about 17.

6. The method as claimed in claim 2, wherein the battery is a lead-acid battery, and constants K, E and q for an individual cell, when an unloaded phase was preceded by charging, are selected from:
   E between about 50 K and about 500 K,
   K between about −0.1 and about −2, and
   q between about 50 $V^{-1}$ and about 1000 $V^{-1}$.

7. The method as claimed in claim 2, wherein E is about 116 K, K is about −0.34, and q is about 190 $V^{-1}$.

8. The method as claimed in claim 2, wherein the battery is a lead-acid battery, and constants E, K and q for an individual cell, when an unloaded phase was preceded by discharging, are selected from:
   E between about 10 K and about 500 K,
   K between about −0.05 and about −1, and
   q between about −50 $V^{-1}$ and about −1000 $V^{-1}$.

9. The method as claimed in claim 2, wherein E is about 60 K, K is about −0.19, and q is about −150 $V^{-1}$.

10. The method as claimed in claim 1, wherein measurement is not carried out until at least one hour after the beginning of the load-free period.

11. The method as claimed in claim 1, further comprising calculating a time interval according to the formula $$to = -t - \frac{\hat{u}}{dUo(t)/dt},$$

at time t after the beginning of the load-free period, wherein dUo(t)/dt is the time derivative of the decaying voltage Uo and $\hat{u}$ is a constant, and the time determination for the measurement of the voltage response during the load-free period is carried out and offset by time interval t according to formula (2):

$$Uoo=Uo(t)-w*\ln(t+to)-w*F(T) \quad (2),$$

wherein w=−(Uo(t2)−Uo(t1))/ln((t2+to)/(t1+to)).

12. The method as claimed in claim 11, wherein the battery is a lead-acid battery, and constant $\hat{u}$ for an individual battery cell has a value of approximately 0.002 V to approximately 0.02 V, at 25° C., and a value of approximately 0.003 V to approximately 0.03 V, at −20° C., and is linearly interpolated or extrapolated for other temperatures.

13. The method as claimed in claim 12, wherein constant $\hat{u}$ is about 0.007 V at 25° C. and about 0.01 V at −20° C.

14. A method of predicting state of charge comprising:
   measuring the voltage settling response of the storage battery according to the method of claim 1; and
   comparing the voltage settling response to true open-circuit voltage Uoo and the decay voltage Uo(t) to determine the state of charge.

* * * * *